(12) United States Patent
Lin

(10) Patent No.: US 9,557,353 B2
(45) Date of Patent: Jan. 31, 2017

(54) POWER SUPPLY DETECTING CIRCUIT

(71) Applicant: HON HAI PRECISION INDUSTRY CO., LTD., New Taipei (TW)

(72) Inventor: Ching-Chung Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 239 days.

(21) Appl. No.: 14/460,178

(22) Filed: Aug. 14, 2014

(65) Prior Publication Data
US 2015/0054489 A1 Feb. 26, 2015

(30) Foreign Application Priority Data
Aug. 21, 2013 (CN) .......................... 2013 1 0365273

(51) Int. Cl.
G01R 31/40 (2014.01)
G01R 19/165 (2006.01)
H02H 3/20 (2006.01)
G06F 1/28 (2006.01)

(52) U.S. Cl.
CPC ........ *G01R 19/16538* (2013.01); *H02H 3/207* (2013.01); *G06F 1/28* (2013.01)

(58) Field of Classification Search
CPC ....... G01R 31/40; G01R 31/42; G01R 19/165; G01R 19/16547; G03B 7/26
See application file for complete search history.

(56) References Cited

U.S. PATENT DOCUMENTS

| | | | | |
|---|---|---|---|---|
| 2012/0262140 A1* | 10/2012 | Divan | ................... | H02M 3/156 323/282 |
| 2012/0281433 A1* | 11/2012 | Yamanaka | ............ | H02M 7/003 363/13 |
| 2013/0313989 A1* | 11/2013 | Chen | ................... | H05B 33/0887 315/200 R |
| 2014/0049993 A1* | 2/2014 | Kelly | .................. | H02M 1/4225 363/44 |

FOREIGN PATENT DOCUMENTS

| | | |
|---|---|---|
| TW | M435093 | 8/2012 |
| TW | M447632 | 2/2013 |
| TW | M457355 | 7/2013 |

* cited by examiner

*Primary Examiner* — Son Le
(74) *Attorney, Agent, or Firm* — Zhigang Ma

(57) ABSTRACT

A power supply detecting circuit includes a power supply module configured to receive a first voltage signal from an alternating current (AC) power source; a voltage converting circuit configured to convert the first voltage signal to a second voltage signal; a switch circuit connected to an output terminal of the voltage converting circuit; a micro control unit (MCU) connected to the switch circuit; and a display module connected to the MCU. The switch circuit outputs a detecting signal to the MCU according to the second voltage signal. The MCU determines whether the first voltage signal is within a predetermined range according to the detecting signal and sending a detecting result to the display module which displays the detecting result.

18 Claims, 2 Drawing Sheets

POWER SUPPLY DETECTING CIRCUIT

CROSS-REFERENCE TO RELATED APPLICATIONS

This application claims priority to China Patent Application No. 201310365273.1 filed on Aug. 21, 2013 in the State Intellectual Property Office of China, the contents of which are incorporated by reference herein.

This application are related to co-pending application entitled, "POWER SUPPLY DETECTING CIRCUIT", filed on Aug. 14, 2014, , application Ser. No. 14/459,941.

FIELD

The present disclosure relates to a power supply detecting circuit.

BACKGROUND

Electronic devices, such as computers or monitors, include a power supply module which can be connected to an alternating current (AC) power source. A typical power supply module converts an AC voltage output from the AC power source to a plurality of direct current (DC) voltages. The DC voltages can be supplied to circuits and electronic components of the electronic device.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
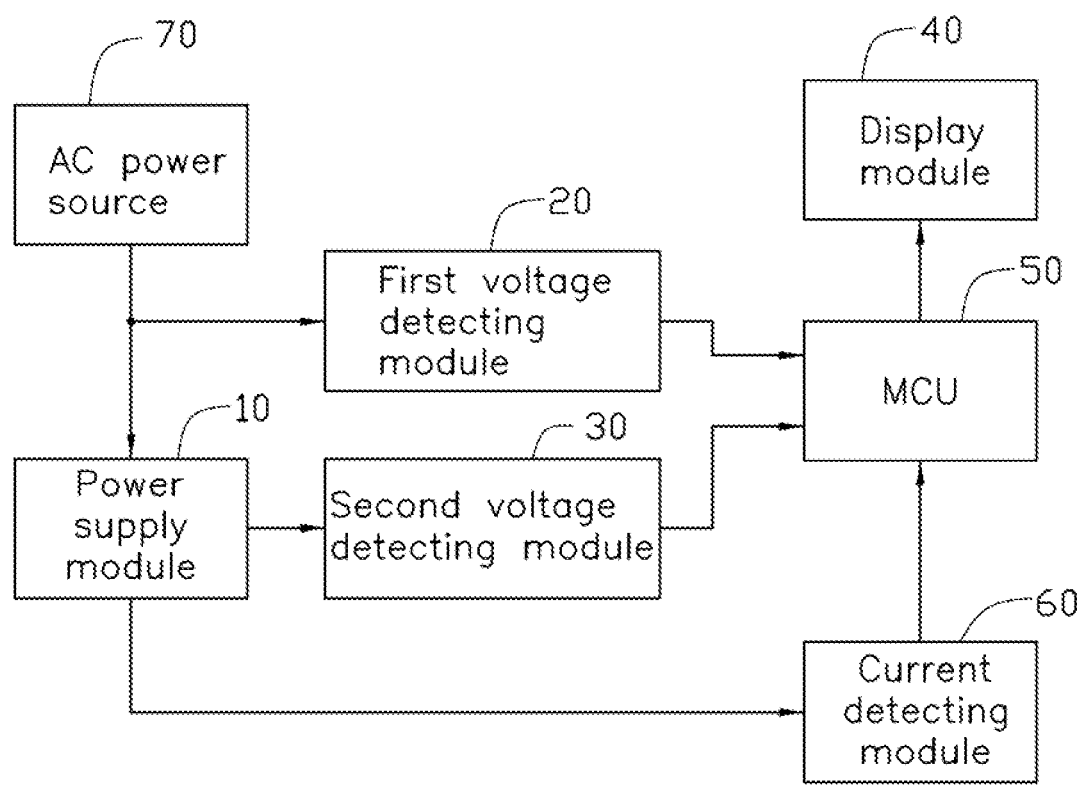
FIG. 1 is a block diagram of an embodiment of the power supply detecting circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIG. 1 illustrates an embodiment of a power supply detecting circuit includes a power supply module 10, a first voltage detecting module 20, a second voltage detecting module 30, a display module 40, a Micro Control Unit (MCU) 50, and a current detecting module 60. The power supply module 10 can convert an AC voltage supplied by the AC power source 70 to DC voltages (e.g., 3.3V, 5V, 12V) which can be fed to electric loads. The electric loads can be circuit boards, electronic modules, and electronic components of an electronic device (e.g., a monitor or a computer).

The first voltage detecting module 20 is connected to a voltage input terminal of the power supply module 10, and configured to detect the AC voltage provided to the power supply module 10. The second voltage detecting module 30 is connected to a voltage output terminal of the power supply module 10, and configured to detect the DC voltage output by the power supply module 10. The current detecting module 60 is connected to the power supply module 10, and configured to detect a current output by the power supply module 10. The first voltage detecting module 20, the second voltage detecting module 30, and the current detecting module 60 are connected to the MCU 50. The MCU 50 can receive voltages and current detected by the first voltage detecting module 20, the second voltage detecting module 30, and the current detecting module 60. The MCU 50 can compare the detected data with corresponding parameters and calculate an output power of the power supply module 10. The display module 40 is connected to the MCU 50 and can display the detected data, the output power of the power supply module 10. The MCU 50 can switch off the power supply module 10 when one or more of the detected data exceed predetermined parameters, thereby preventing damage to the electronic device due to over-current or over-voltage.

Figure 2:
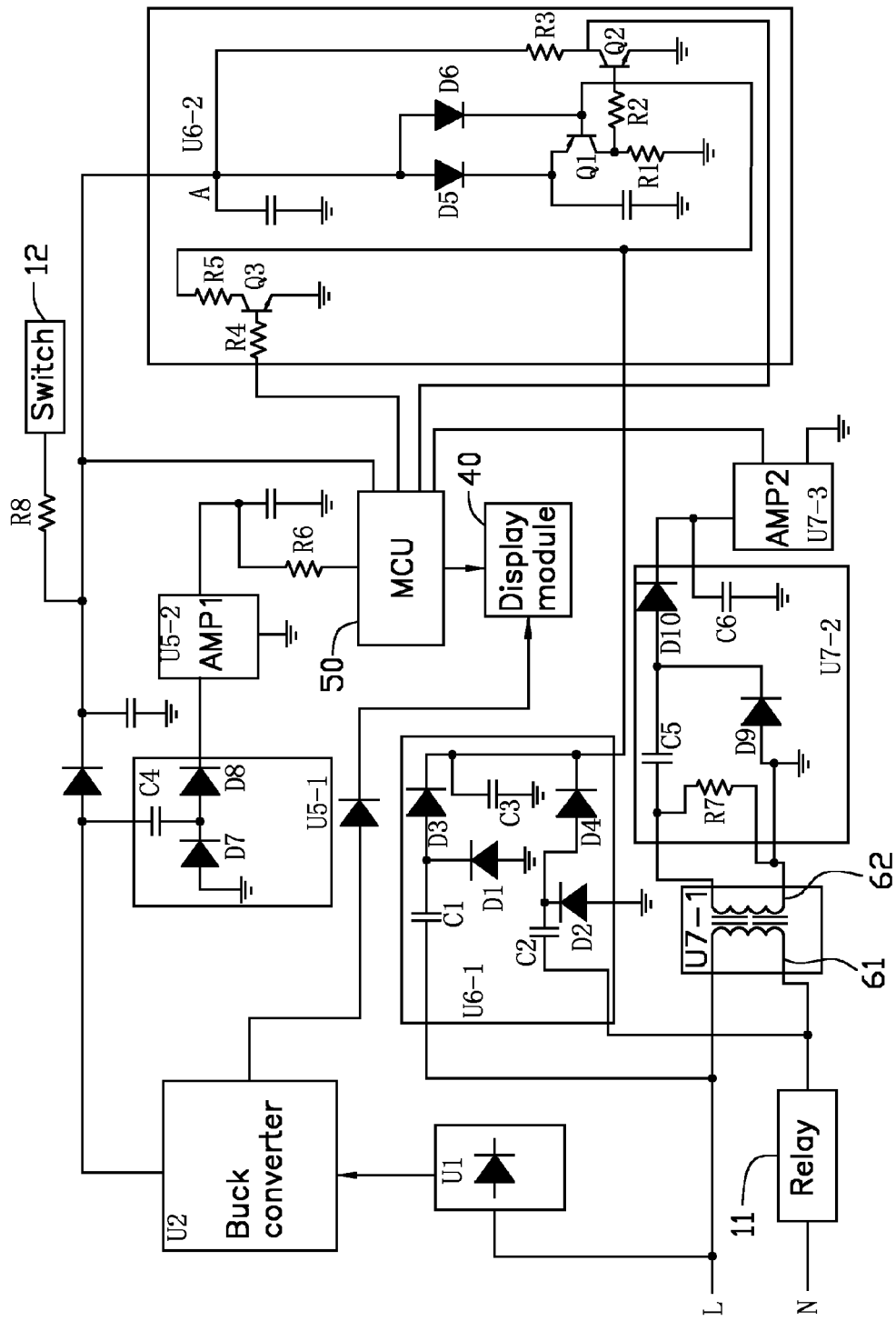
FIG. 2 illustrates a detailed circuit of the power supply detecting circuit of FIG. 1.

FIGS. 1 and 2 illustrate the power supply module 10 includes a first input terminal L and a second input terminal N. The first input terminal L can be connected to a live wire of the AC power source 70. The second input terminal N can be connected to a null wire of the AC power source 70. The power supply module 10 includes a bridge rectifier circuit U1 connected to the first input terminal L and a buck converter U2 connected to the bridge rectifier circuit U1. The bridge rectifier circuit U1 can convert an AC input into a DC output. The buck converter U2 can convert a voltage output from the bridge rectifier circuit U1 to a low DC voltage (e.g., 5V, 3.3V, or 12V). A relay 11 is connected to the second input terminal N. When the first voltage detecting module 20 detects that the AC voltage supplied by the AC power source 70 is overvoltage, the relay 11 disconnects the AC power source 70 from the power supply module 10.

FIGS. 1 and 2 illustrate the first voltage detecting module 20 includes a voltage converting circuit U6-1 connected to the first input terminal L and a switch circuit U6-2 connected to the voltage converting circuit U6-1. The voltage converting circuit U6-1 includes capacitors C1-C3 and diodes D1-D4. The diode D1-D4 can rectify the AC voltage output to the first input terminal L. The capacitor C1-C3 can filter the AC voltage output to the first input terminal L. In one embodiment, the capacitors C1 and C2 are voltage step-down capacitors.

The switch circuit U6-2 compares an output voltage of the buck converter 20 with an output voltage of the voltage converting circuit U6-1 and outputs a detecting signal to the MCU according to the result of comparing. The switch circuit U6-2 includes a first transistor Q1, a second transistor Q2, a third transistor Q3, diodes D5-D6 and resistors R1-R5. In one embodiment, the first transistor Q1 is a PNP-type transistor. The second transistor Q2 and the third transistor Q3 are NPN-type transistors. When the output voltage of the voltage converting circuit U6-1 is greater than a voltage of a node A, the diode D6 is switched off. The first transistor Q1 is switched off. A base terminal of the second transistor Q2 is connected to ground via the resistors R1 and R2. The second transistor Q2 is switched off. The voltage of the node A is supplied from the output voltage of the buck converter 20. A collector terminal of the second transistor Q2 is connected to the MCU 50 via the resistor R3 and is at a high-logic level (e.g., 5V). When the output voltage of the voltage converting circuit U6-1 is not greater than the predetermined voltage, the first transistor Q1 and the second transistor Q2 are switched on. The collector terminal of the second transistor Q2 is at a low-logic level. The MCU 50 can analyze the high-logic level signal and the low-logic level signal and judge whether the AC voltage supplied to the power supply module 10 is within a predetermined range.

The MCU 50 can output a signal to switch on or off the third transistor Q3. When the third transistor Q3 is switched on, the capacitor C3 can be discharged. When the third transistor Q3 is switched off, the capacitor C3 can be charged.

FIGS. 1 and 2 illustrate the second voltage detecting module 30 includes a voltage detecting unit U5-1 and a first amplifier U5-2 connected to the voltage detecting unit U5-1. The voltage detecting unit U5-1 includes a capacitor C4 and diodes D7-D8. One terminal of the capacitor C4 is connected to an output terminal of the buck converter U2. The other terminal of the capacitor C4 is connected to a positive terminal of the diode D8 and a negative terminal of the diode D7. A positive terminal of the diode D7 is grounded. A negative terminal of the diode D8 is connected to the first amplifier U5-2. The diodes D7-D8 and capacitor C4 can rectify and filter an output voltage of the buck converter U2 and output a rectified and filtered voltage to the first amplifier U5-2. The first amplifier U5-2 can amplify the rectified and filtered voltage output by the voltage detecting unit U5-1 and output an amplified voltage to the MCU 50 via a resistor R6. The MCU 50 calculates the output voltage of the power supply module 10 according to the amplified voltage output by the first amplifier U5-2. In one embodiment, the capacitor C4 is a voltage step-down capacitor.

FIGS. 1 and 2 illustrate the current detecting module 60 includes a transformer U7-1, a current detecting circuit U7-2 connected to the transformer U7-1, and a second amplifier U7-3 connected to the current detecting circuit U7-2. The transformer U7-1 includes a primary coil 61 and a secondary coil 62. One terminal of the primary coil 61 is connected to the first input terminal L. The other terminal of the primary coil 61 is connected to the second input terminal N. Two terminals of the secondary coil 62 are connected to the current detecting circuit U7-2. The current detecting circuit U7-2 includes a resistor R7, capacitors C5-C6, and diodes D9-D10. One terminal of the resistor R7 is connected to a first terminal of the secondary coil 62. The other terminal of the resistor R7 is connected to a second terminal of the secondary coil 62. One terminal of the capacitor C5 is connected to the first terminal of the secondary coil 62. The other terminal of the capacitor C5 is connected to a positive terminal of the diode D10. A negative terminal of diode D10 is connected to the second amplifier U7-3. The second terminal of the secondary coil 62 and a positive terminal of the diode D9 are grounded. A negative terminal of the diode D9 is connected to the positive terminal of the diode D10. One terminal of the capacitor C6 is connected to a negative terminal of the diode D10 and the second amplifier U7-3. The other terminal of the capacitor C6 is grounded. The transformer U7-1 can transform an input current flowing through the primary coil 61 to an output current flowing through the secondary coil 62. The current detecting circuit U7-2 can detect the output current flowing through the secondary coil 62. The diodes D9-D10 and capacitors C5-C6 can rectify and filter the output current and output the rectified and filtered current to the second amplifier U7-3. The second amplifier U7-3 amplifies the rectified and filtered current output by the current detecting circuit U7-2 and outputs the amplified current to the MCU 50. The MCU 50 can calculate the output current of the power supply module 10 according to the amplified current output by the second amplifier U7-3.

FIG. 2 illustrates the output terminal of the buck converter U2 is connected to a resistor R8 via a diode D11. A switch member 12 is connected to the resistor R8. In one embodiment, the switch member 12 can be transistor. The MCU 50 can control an on/off state of the switch member 12. The resistor R8 can be a dummy load. When the switch member 12 is switched off, the power supply module 10 can output current and voltage to the resistor R8. The system can calculate an input power, output power, and a power conversion efficiency of the power supply module 10.

The embodiments shown and described above are only examples. Many details are often found in the art such as the other features of an automatic power supply detecting circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A power supply detecting circuit comprising:
   a power supply module configured to receive a first voltage signal from an alternating current (AC) power source and comprising a bridge rectifier circuit coupled to the first voltage signal and a buck converter connected to the bridge rectifier;
   a voltage converting circuit configured to convert the first voltage signal to a second voltage signal;
   a switch circuit connected to an output terminal of each of the voltage converting circuit and the buck converter;
   a micro control unit (MCU) connected to the switch circuit; and
   a display module connected to the MCU;
   wherein the switch circuit compares an output voltage of the buck converter with the second voltage signal and outputs a detecting signal to the MCU according to the result of comparing, the MCU determines whether the first voltage signal is within a predetermined range according to the detecting signal and sends a result of determination to the display module which displays the result.

2. The power supply detecting circuit of claim 1, further comprising a relay coupled to the first voltage signal, wherein when the first voltage signal is not within the predetermined range, the MCU controls the relay to be switched off to power off the power supply module; and when the first voltage signal is within the predetermined range, the relay is switched on to power on the power supply module.

3. The power supply detecting circuit of claim 1, wherein the voltage converting circuit comprises a first capacitor, a first diode, a third diode, and a third capacitor; one terminal of the first capacitor is coupled to a live wire of the AC power source for receiving the first voltage signal, the other terminal of the first capacitor is connected to a negative terminal of the first diode and a positive terminal of the third diode; a positive terminal of the first diode is grounded; a negative terminal of the third diode is connected to one terminal of the third capacitor and an output terminal of the voltage converting circuit, the other terminal of the third capacitor is grounded.

4. The power supply detecting circuit of claim 3, wherein the voltage converting circuit further comprises a second capacitor, a second diode, and a fourth diode, one terminal of the second capacitor is coupled to a null wire of the AC power source, the other terminal of the second capacitor is connected to a negative terminal of the second diode and a positive terminal of the fourth diode; a positive terminal of the second diode is grounded, a negative terminal of the fourth diode is connected to the output terminal of the voltage converting circuit.

5. The power supply detecting circuit of claim 4, wherein the switch circuit comprises a first transistor and a second transistor, a base terminal of the first transistor is connected to the output terminal of the voltage converting circuit, an emitter terminal of the first transistor is connected to an output terminal of the buck converter, and a collector terminal of the first transistor is connected to ground via a first resistor; a base terminal of the second transistor is connected to the collector terminal of the first transistor via a second resistor, a collector terminal of the second transistor is connected to the output terminal of the buck converter via a third resistor; and an emitter terminal of the second transistor is grounded.

6. The power supply detecting circuit of claim 5, wherein the emitter terminal of the first transistor is connected to the output terminal of the buck converter via a fifth diode, a positive terminal of the fifth diode is connected to the output terminal of the buck converter, a negative terminal of the fifth diode is connected to the emitter terminal of the first transistor; a positive terminal of a sixth diode is connected to the positive terminal of the fifth diode, and a negative terminal of the sixth diode is connected to the base terminal of the first transistor.

7. The power supply detecting circuit of claim 5, wherein the first transistor is a PNP-type bipolar transistor, and the second transistor is an NPN-type bipolar transistor.

8. The power supply detecting circuit of claim 5, wherein the switch circuit further comprises a third transistor, a base terminal of the third transistor is connected to the MCU via a fourth resistor, a collector terminal of the third transistor is connected to the output terminal of the voltage converting circuit via a fifth resistor, and an emitter terminal of the third transistor is connected to ground; when the power supply module is switched off, the MCU switches on the third transistor for discharging the third capacitor.

9. The power supply detecting circuit of claim 8, wherein the third transistor is an NPN-type bipolar transistor.

10. A power supply detecting circuit comprising:
a power supply module for receiving a first voltage signal supplied by an alternating current (AC) power source and comprising a bridge rectifier circuit coupled to the first voltage signal and a buck converter connected to the bridge rectifier, and the buck converter is configured to convert the first voltage signal to a plurality of direct current (DC) voltages;
a voltage converting circuit configured to convert the first voltage signal to a second voltage signal; a voltage of the second voltage signal being less than the voltage of the first voltage signal;
a switch circuit connected to an output terminal of each of the voltage converting circuit and the buck converter;
a micro control unit (MCU) connected to the switch circuit; and
a display module connected to the MCU;
wherein the switch circuit compares an output voltage of the buck converter with the second voltage signal and outputs a detecting signal to the MCU according to the result of comparing, the MCU determines whether the first voltage signal is within a predetermined range according to the detecting signal and sends a result of determining to the display module which displays the result.

11. The power supply detecting circuit of claim 10, further comprising a relay coupled to the first voltage signal, wherein when the first voltage signal is not within the predetermined range, the MCU controls the relay to be switched off to power off the power supply module; and when the first voltage signal is within the predetermined range, the relay is switched on to power on the power supply module.

12. The power supply detecting circuit of claim 10, wherein the voltage converting circuit comprises a first capacitor, a first diode, a third diode, and a third capacitor; one terminal of the first capacitor is coupled to a live wire of the AC power source for receiving the first voltage signal, the other terminal of the first capacitor is connected to a negative terminal of the first diode and a positive terminal of the third diode; a positive terminal of the first diode is grounded; a negative terminal of the third diode is connected to one terminal of the third capacitor and an output terminal of the voltage converting circuit, the other terminal of the third capacitor is grounded.

13. The power supply detecting circuit of claim 12, wherein the voltage converting circuit further comprises a second capacitor, a second diode, and a fourth diode, one terminal of the second capacitor is coupled to a null wire of the AC power source, the other terminal of the second capacitor is connected to a negative terminal of the second diode and a positive terminal of the fourth diode; a positive terminal of the second diode is grounded, a negative terminal of the fourth diode is connected to the output terminal of the voltage converting circuit.

14. The power supply detecting circuit of claim 13, wherein the switch circuit comprises a first transistor and a second transistor, a base terminal of the first transistor is connected to the output terminal of the voltage converting circuit, an emitter terminal of the first transistor is connected to an output terminal of the buck converter, and a collector terminal of the first transistor is connected to ground via a first resistor; a base terminal of the second transistor is connected to the collector terminal of the first transistor via a second resistor, a collector terminal of the second transistor is connected to the output terminal of the buck converter via a third resistor; and an emitter terminal of the second transistor is grounded.

15. The power supply detecting circuit of claim 14, wherein the emitter terminal of the first transistor is connected to the output terminal of the buck converter via a fifth diode, a positive terminal of the fifth diode is connected to the output terminal of the buck converter, a negative terminal of the fifth diode is connected to the emitter terminal of the first transistor; a positive terminal of a sixth diode is connected to the positive terminal of the fifth diode, and a negative terminal of the sixth diode is connected to the base terminal of the first transistor.

16. The power supply detecting circuit of claim 14, wherein the first transistor is a PNP-type bipolar transistor, and the second transistor is an NPN-type bipolar transistor.

17. The power supply detecting circuit of claim 14, wherein the switch circuit further comprises a third transistor, a base terminal of the third transistor is connected to the MCU via a fourth resistor, a collector terminal of the third transistor is connected to the output terminal of the voltage converting circuit via a fifth resistor, and an emitter terminal of the third transistor is connected to ground; when the power supply module is switched off, the MCU switches on the third transistor for discharging the third capacitor.

18. The power supply detecting circuit of claim 17, wherein the third transistor is an NPN-type bipolar transistor.

* * * * *